United States Patent [19]

Yamazaki

[11] 4,239,554
[45] Dec. 16, 1980

[54] SEMICONDUCTOR PHOTOELECTRIC CONVERSION DEVICE

[76] Inventor: Shunpei Yamazaki, 21-21 Kitakarasuyama 7-chome, Setagaya-ku, Tokyo, Japan

[21] Appl. No.: 58,077

[22] Filed: Jul. 16, 1979

[30] Foreign Application Priority Data

Jul. 17, 1978 [JP] Japan .................................. 53-86867
Jul. 17, 1978 [JP] Japan .................................. 53-86868

[51] Int. Cl.$^3$ ............................................. H01L 31/06
[52] U.S. Cl. .................................... 136/255; 136/258; 357/2; 357/30
[58] Field of Search .......... 136/89 SJ, 89 TF, 89 GA, 136/89 MS, 89 SG; 357/2, 30

[56] References Cited

U.S. PATENT DOCUMENTS

| | | | |
|---|---|---|---|
| 3,015,762 | 1/1962 | Shockley | 357/20 |
| 4,109,271 | 8/1978 | Pankove | 357/30 |

OTHER PUBLICATIONS

M. H. Brodsky et al. "Hydrogenation & Doping Of Amorphous GaAs & Semiconductor Devices Made Therefrom", *IBM Technical Disclosure Bulletin*, vol. 20, pp. 4962–4963, (1978).

L. E. Stone et al. "Integrally Composed Variable Energy Gap Photovoltaic Cells", *Progress in Astronautics & Rocketry*, vol. III, (1961), pp. 299–315.

*Primary Examiner*—Aaron Weisstuch

*Attorney, Agent, or Firm*—Gerald J. Ferguson, Jr.; Joseph J. Baker

[57] ABSTRACT

A semiconductor photoelectric conversion device employing a semiconductor layer which has at least one inter-semiconductor heterojunction. The semiconductor layer is composed of at least a first non-single-crystal semiconductor region having a first energy gap, a second non-single-crystal semiconductor region having a second energy gap different from the first energy gap and a third non-single-crystal semiconductor region serving as the heterojunction formed to extend between the first and second semiconductor regions and having an energy gap continuously changing from the first energy gap on the side of the first semiconductor region to the second energy gap on the side of the second semiconductor region. The semiconductor layer is doped with a recombination center neutralizer and a conductive material.

The non-single-crystal semiconductor layer doped with the conductive material is formed on a substrate by a low pressure chemical vapor deposition or glow discharge method. Then, the non-single-crystal semiconductor layer is exposed to a hydrogen gas or a mixture thereof with a small amount of halogen so that the non-single-crystal semiconductor layer is doped with hydrogen or halogen as a recombination center neutralizer, whereby to obtain the semiconductor photoelectric conversion device.

7 Claims, 8 Drawing Figures

SEMICONDUCTOR PHOTOELECTRIC CONVERSION DEVICE

BACKGROUND OF THE INVENTION

1. Field of the Invention

This invention relates to a semiconductor photoelectric conversion device employing a semiconductor layer having at least one inter-semiconductor heterojunction, and it also pertains to a method of making such a semiconductor photoelectric conversion device.

2. Description of the Prior Art

Heretofore, there have been proposed a variety of photoelectric conversion devices which employ a semiconductor layer having at least one inter-semiconductor heterojunction.

Typical photoelectric conversion devices are a p-n or n-p type photodiode having one p-n heterojunction, a p-i-n or n-i-p type photodiode having one p-i heterojunction and one n-i heterojunction, a p-i-i-n or n-i-i-p type photocell having one p-i heterojunction, one i-i heterojunction and one n-i heterojunction, a p-n-p-n or n-p-n-p type photocell having three p-n heterojunctions, a p-i-n-i-p-i-n type photocell having two p-i heterojunctions and three n-i heterojunctions.

These semiconductor photoelectric conversion devices are of the type that make effective use of a difference in height between a barrier against electrons injected from one of two semiconductor regions into the other across a heterojunction defined therebetween and a barrier against holes injected from the latter to the former.

The conventional photoelectric conversion devices are all made of a single crystal semiconductor. There is a certain limit to mass production of single crystal semiconductors in terms of manufacturing techniques and economy; this imposes certain limitations on mass production of the semiconductor photoelectric conversion devices.

Further, the semiconductor photoelectric conversion devices made of single crystal semiconductor have abrupt heterojunctions, each formed between two single crystal semiconductor regions having different energy gaps. Since there is a difference in lattice constant between the two single-crystal semiconductor regions having defined therebetween the abrupt heterojunction, dangling bonds are formed locally at the position of the heterojunction, and consequently interface states or defects are present locally at the position of the heterojunction, resulting in an energy band structure that has, at the position of the heterojunction, an energy spike or notch extending towards either one of a valence band or a conduction band.

Accordingly, in the conventional photoelectric conversion devices, during operation electrons or holes to be injected from one of the two semiconductor regions into the other across the heterojunction are partly absorbed by the interface states or defects appearing at the position of the heterojunction, and migration of electrons or holes from one of the two semiconductor regions to the other across the heterojunction is limited by the energy spike or notch at the position of the heterojunction; therefore, there is a certain limit to obtaining high photoelectric conversion efficiency in the prior art.

SUMMARY OF THE INVENTION

Accordingly, the present invention has as its object to provide a novel semiconductor photoelectric conversion device which is free from the abovesaid defect of the prior art.

The semiconductor photoelectric conversion device of this invention is made of a non-single-crystal semiconductor, and hence can easily be mass produced at low cost.

Further, the semiconductor photoelectric conversion device of this invention has a non-single-crystal semiconductor layer which is composed of at least first and second non-single crystal semiconductor regions having different energy gaps and a third non-single-crystal semiconductor region defined as a heterojunction between the first and second non-single-crystal semiconductor regions, and a recombination center neutralizer is doped in the non-single-crystal semiconductor layer. As a consequence, substantially no dangling bonds are present at the heterojunction and at any other places in the non-single-crystal semiconductor layer. The third non-single-crystal semiconductor region serving as the heterojunction has an energy gap which continuously changes from a first energy gap on the side of the first non-single-crystal semiconductor region to a second energy gap on the side of the second non-single-crystal semiconductor region. Accordingly, in terms of energy band structure, the semiconductor photoelectric conversion device of this invention does not have, at the position of the heterojunction and at any other places, any energy spike or notch extending towards either one of the valence band and the conduction band nor does it have any interface states or defects. Moreover, since a conductive material is doped in the non-single-crystal semiconductor layer, high electron and hole mobility is provided.

Accordingly, the semiconductor photoelectric conversion device of this invention achieves high photoelectric conversion efficiency.

DESCRIPTION OF THE PREFERRED EMBODIMENTS

Figure 1:
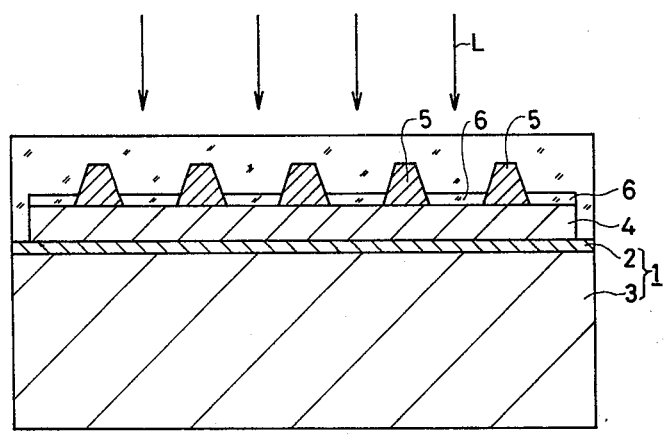
FIG. 1 is a cross-sectional view schematically showing an example of a semiconductor photoelectric conversion device of this invention.

FIG. 1 shows an example of the semiconductor photoelectric conversion device of this invention which has a photodiode structure. Reference numeral 1 indicates a substrate in which a film of tungsten, molybdenum, titanium or like metal is deposited as an electrode 2 on an insulating layer 3 as of alumina, magnesia, beryllia, ferrite, glass or the like. A non-single-crystal semiconductor layer 4 is formed on the substrate 1.

Figure 2:
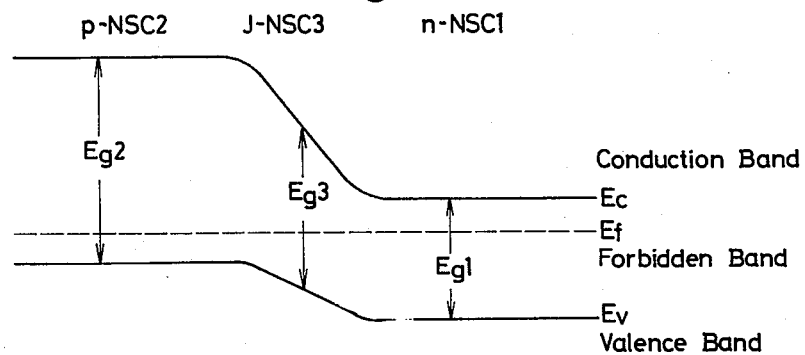
FIG. 2 is an energy band structure showing the construction of an example of a semiconductor layer utilized in the example of FIG. 1.

An example of the non-single-crystal semiconductor layer 4 comprises, in terms of energy band structure as shown in FIG. 2, an n-type non-single-crystal semiconductor region n-NSC$_1$ having an energy gap E$_{g1}$ on the side of the electrode 2 and, on the opposite side therefrom, a p-type non-single-crystal semiconductor region p-NSC$_2$ having an energy gap E$_{g2}$ larger than that E$_{g1}$ of the semiconductor region n-NSC$_1$ and a non-single-crystal semiconductor region J-NSC$_3$ serving as a heterojunction defined between the semiconductor regions n-NSC$_1$ and p-NSC$_2$. The energy band structure in FIGS. 2, 3 and 5 to 8 are shown to be in thermal balance states. In FIGS. 1 to 8, inclusive, reference characters E$_f$, E$_c$ and E$_v$ indicate the Fermi level, the bottom level of the conduction band and the top level of the valence band, respectively. In this case, the semiconductor region J-NSC$_3$ forms a transition region in which the n-type conductivity type on the side of the semiconductor region n-NSC$_1$ is changed to the p-type conductivity type on the side of the semiconductor region p-NSC$_2$ and which has an energy gap E$_{g3}$ continuously decreasing from the energy gap E$_{g2}$ on the side of the semiconductor region p-NSC$_2$ towards the energy gap E$_{g1}$ on the side of the semiconductor region n-NSC$_1$. The semiconductor region n-NSC$_1$ is formed, for example, of non-single crystal of Si and has the energy gap E$_{g1}$ substantially equal to 1.1 eV. The semiconductor region p-NSC$_2$ is formed, for example, of non-single crystal of Si$_x$C$_{1-x}$ ($0.5<x<1$) in which case the energy gap E$_{g2}$ is in the range of 1.1 to 3.5 eV, Si$_3$N$_{4-x}$ ($0<x<4$) in which case the energy gap E$_{g2}$ is in the range of about 1.1 to 6.0 eV, or SiO$_{2-x}$ ($0<x<2$) in which case the energy gap E$_{g2}$ is in the range of 1.1 to 8.0 eV. The semiconductor region J-NSC$_3$ is formed, for example, of non-single crystal of Si$_y$C$_{1-y}$, Si$_3$N$_{4-y}$ or SiO$_{2-y}$ (where the value of y is larger than that of x and continuously changes from the value of x on the side of the semiconductor region p-NSC$_2$ to the value 1 and has the energy gap E$_{g3}$ which assumes a value intermediate between the energy gaps E$_{g1}$ and E$_{g2}$ of the semiconductor regions n-NSC$_1$ and p-NSC$_2$.

The semiconductor layer 4 comprising the semiconductor regions n-NSC$_1$, p-NSC$_2$ and J-NSC$_3$ has doped therein a recombination center neutralizer, such as hydrogen, deuterium, fluorine, chlorine, bromine or halogenide, at a concentration of 0.1 to 200 mol%.

The n-type non-single-crystal semiconductor region n-NSC$_1$ has doped therein an n-type impurity for making it n-type, such as, for example, arsenic (As), phosphorus (P), or the like, and at the same time, the semiconductor region n-NSC$_1$ has doped therein, for increasing its conductivity on the side of the electrode 2 of the semiconductor layer 4, a conductive material which also acts as an n-type impurity, such as antimony (Sb), tellurium (Te), or the like. The p-type non-single-crystal semiconductor region p-NSC$_2$ has doped therein, for making it p-type, a p-type impurity, for example, boron (B), cadmium (Cd), or the like and, for enhancing conductivity on the opposite side from the electrode of the semiconductor layer 4, a conductive material which also serves as a p-type impurity, such as, for example, indium (In), aluminum (Al), gallium (Ga). In the area of the non-single-crystal semiconductor region J-NSC$_3$ adjoining the semiconductor region n-NSC$_1$, there are doped the same n-type impurity and conductive materials as those doped in the semiconductor region n-NSC$_1$, whereas in the area adjoining the semiconductor region p-NSC$_2$, there are doped the same p-type impurity and conductive materials as those doped in the semiconductor region p-NSC$_2$. In the central portion of the semiconductor region J-NSC$_3$, an n-type impurity and a p-type impurity are doped so that they are compensated, and the same conductive materials as those doped in the semiconductor regions n-NSC$_1$ and p-NSC$_2$ respectively are doped so that they are compensated. For enhancing the conductivity of the semiconductor layer 4, there is doped, as required, in the semicoductor regions n-NSC$_1$, p-NSC$_2$ and J-NSC$_3$ a conductive material which has no affect on their conductivity type, such as, for example, tin (Sn), lead (Pb), or the like.

On the non-single-crystal semiconductor layer 4, that is, on its p-type semiconductor region p-NSC$_2$, there are deposited in the form of a matrix, mesh or comb metal electrode 5 made of titanium, aluminum, nickel, chromium, or the like in an ohmically contacting manner. Those areas of the p-type semiconductor region p-NSC$_2$ on which the metal electrode 5 is not formed are each covered with a transparent anti-reflection film 6 as of silicon nitride Si$_3$N$_4$, silicon oxide SiO$_2$, or the like. Further, a transparent protective film 7 made of synthetic resin, glass or the like is deposited over the entire semiconductor layer 4 to cover the metal electrode 5 and the anti-reflection film 6.

In the manufacture of a such a semiconductor layer 4, a silicide gas (such as silane (SiH$_4$), dichlorosilane (SiH$_2$Cl$_2$), silicon tetrachloride (SiCl$_4$) or silicon tetrafluoride (SiF$_4$) gas), a nitride gas (such as ammonium (NH$_3$) or hydrazine (P$_2$H$_4$) gas), a carbonide gas (such as methane (CH$_4$), propane (C$_3$H$_8$), carbon tetrachloride (CCl$_4$), fluorine tetrachloride (CF$_4$) gas) or oxygen or oxide gas, a p-type impurity material gas (such as diborane (B$_2$H$_6$), AlCl$_4$ gas), an n-type impurity material gas (such as phosphine (PH$_3$) or arsine (AsH$_3$) gas), an n-type conductive material gas (such as antimony hydride or halide gas), a p-type conductive material gas (such as indium, gallium or like hydride or halide gas), a conductive material gas which does not provide any conductivity type (such as SnCl$_4$, GeH$_4$, GeCl$_4$ or PbCl$_4$ gas), and a carrier gas (such as hydrogen gas) are individually adjusted in quantity in accordance with a predetermined program and then introduced into a reaction furnace in which is placed the substrate 1 having mounted thereon the electrode 2. In the reaction furnace, by the so-called low pressure chemical vapor deposition method or glow discharge method, the aforesaid semiconductor regions n-NSC$_1$, p-NSC$_2$ and J-NSC$_3$ are formed successively. In this case, the semiconductor layer 4 is provided in amorphous or polycrystalline form depending on whether the substrate temperature is in the range of room temperature to 500° C. or 350° to 900° C. Thereafter, by heating the substrate 1 at room temperature or up to a temperature below 200° C. together with the atmosphere (hydrogen gas or a mixture thereof with a small amount of halogen) in the reaction furnace by high-frequency induction or by the combined use of high-frequency induction and radiation, the recombination center neutralizers (hydrogen or halogen) are doped in the semiconductor layer 4.

The above is one example of the semiconductor photoelectric conversion device of this invention which has a semiconductor layer 4 composed of n-type non-single-crystal semiconductor region n-NSC$_1$, p-type non-single-crystal semiconductor region p-NSC$_2$ and semiconductor region J-NSC$_3$ serving as a p-n heterojunction.

With such an arrangement, there is formed in the energy band structure of the semiconductor layer 4 the p-n heterojunction J-NSC$_3$ which extends between the semiconductor regions n-NSC$_1$ and p-NSC$_2$ and whose energy gap E$_{g3}$ continuously changes from the energy gap E$_{g1}$ on the side of the semiconductor region n-NSC$_1$ to the energy gap E$_{g2}$ on the side of the semiconductor region p-NSC$_2$, but there is not formed at the position of the heterojunction any energy spike or notch extending towards either one of the valence band and the conduction band and no interface states or defects are formed.

Figure 3:
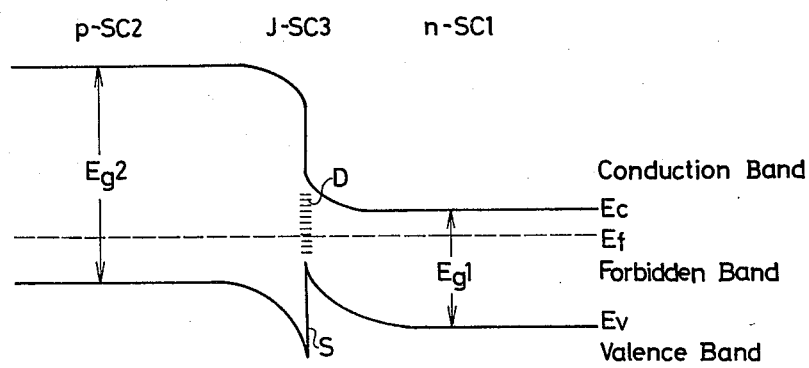
FIG. 3 is an energy band structure showing the construction of a semiconductor layer used in a conventional semiconductor photoelectric conversion device.

Incidentally, if a semiconductor layer, corresponding to the abovesaid one of this invention which has one p-n heterojunction is made of a single-crystal semiconductor, then it will have such an energy band structure as shown in FIG. 3 which comprises an n-type single-crystal semiconductor region n-SC$_1$ having an energy gap E$_{g1}$, a p-type single-crystal semiconductor region p-SC$_2$ having an energy gap E$_{g2}$ and a single-crystal semiconductor region J-SC$_3$ serving as a p-n heterojunction which extends between the n-type and p-type semiconductor regions n-SC$_1$ and p-SC$_2$ and forms a transition region in which the n-type conductivity on the side of the semiconductor region n-SC$_1$ is changed to p-type conductivity on the side of the semiconductor region p-SC$_2$. In this case there are formed at the position of the heterojunction interface states or defects, as indicated by D, and an energy spike extending towards the valence band as indicated by S; however, the present invention does not permit the formation of such interface states or defects D and energy spike S.

Further, in the present invention, the recombination center neutralizers doped in the semiconductor layer 4 are bonded with dangling bonds which are distributed at low density in the semiconductor regions n-NSC$_1$, p-NSC$_2$ and J-NSC$_3$ unless such neutralizers are doped therein, and as a consequence, substantially no such dangling bonds are present in the semiconductor layer 4.

With the present invention, light L enters the semiconductor layer 4 from the side of the semiconductor region p-NSC$_2$, as shown in FIG. 1, and electrons and holes are generated by the incident light in the semiconductor layer 4 and move towards electrodes 2 and 5 respectively. In this case, since the conductive material is doped in the semiconductor layer 4, the electrons and the holes efficiently move towards the electrodes 2 and 5 respectively.

Accordingly, the semiconductor photoelectric conversion device of this invention provides a photoelectric conversion efficiency as high as 5 to 20%.

Further, the semiconductor layer 4 is formed of a non-single-crystal semiconductor and hence can easily be formed on the electrode 2 which is not of single crystal material; therefore, the semiconductor photoelectric conversion device of this invention can easily be mass produced at low cost.

Figure 4:
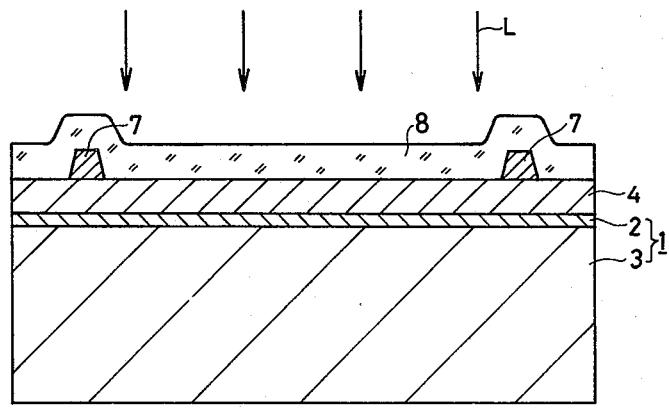
FIG. 4 is a cross-sectional view schematically illustrating another example of the semiconductor photoelectric conversion device of this invention.

FIG. 4 shows another example of the semiconductor photoelectric conversion device of this invention. In FIG. 4, parts corresponding to those in FIG. 1 are identified by the same reference numerals and no detailed description will be repeated. The example of FIG. 4 is identical in construction with the example of FIG. 1 except in that the metal electrode 5, the anti-reflection film 6 and the protective film 7 utilized in the latter are removed, lead electrode 7 made of metal is formed on the non-single-crystal semiconductor layer 4 at its peripheral portion and a transparent electrode 8 of a nonmetallic material, for example, SnO$_2$, is deposited on the non-single-crystal semiconductor layer 4 to cover the metal electrode 7.

The semiconductor photoelectric conversion device of FIG. 4 is identical in construction with the device of FIG. 1 except in the abovesaid points. Accordingly, the non-single-crystal semiconductor layer 4 has the structure described previously in respect of FIG. 2, and the recombination center neutralizer and the conductive material are doped in the semiconductor layer 4, so that the device of FIG. 4 exhibits the same features as the device of FIG. 1 though not described in detail.

The above has described an example of this invention as being applied to a semiconductor photoelectric conversion device of the type that has one p-n heterojunction in the semiconductor layer 4, that is, constitutes a p-n type photodiode, but the present invention is also applicable to a semiconductor photoelectric conversion device which has an apparent structure identical with that described previously with respect to FIG. 1 or 4 but in which the semiconductor layer 4 has one p-i heterojunction and one n-i heterojunction, that is, a p-i-n type photo diode is provided.

Figure 5:
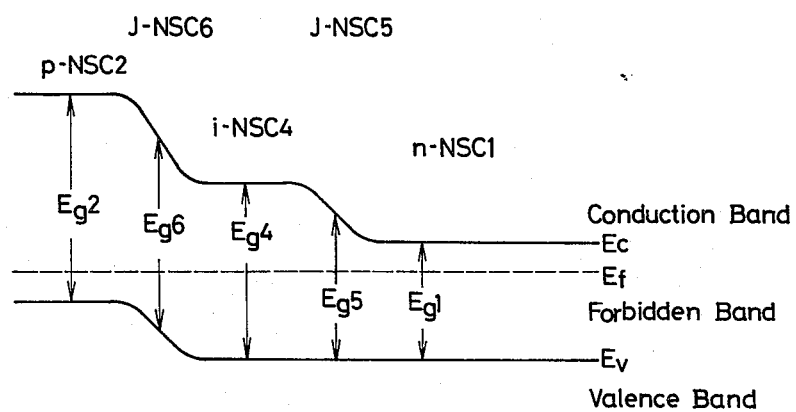
FIGS. 5, 6, 7 and 8 are energy band structures showing modified forms of the construction of the semiconductor layer used in the example of FIG. 1 or 4.

FIG. 5 illustrates, in terms of energy band structure of an example of the semiconductor layer 4 in the case where this invention is applied to a semiconductor photoelectric conversion device which appears to be similar in construction to that described previously with regard to FIGS. 1 and 4 but in which the semiconductor layer 4 has a p-i-n type photodiode structure. The semiconductor layer 4 is composed of an n-type non-single-crystal semiconductor region n-NSC$_1$ which lies on the side of the electrode 2 and has an energy gap E$_{g1}$, a p-type non-single-crystal semiconductor region p-NSC$_2$ which lies on the side of the electrode 5 or 7 and has an energy gap E$_{g2}$ larger than that E$_{g1}$, an i-type non-single-crystal semiconductor region i-NSC$_4$ which lies in the central portion of the layer 4 and has an energy gap E$_{g4}$ intermediate between the energy gaps E$_{g1}$ and E$_{g2}$, a non-single-crystal semiconductor region J-NSC$_5$ which is defined between the semiconductor regions n-NSC$_1$ and i-NSC$_4$ and serves as an n-i heterojunction, and a non-single-crystal semiconductor region J-NSC$_6$ which is defined between the semiconductor regions i-NSC$_4$ and p-NSC$_2$ and acts as a p-i heterojunction. In this case, the semiconductor region J-NSC$_5$ has an energy gap E$_{g5}$ which continuously changes from the energy gap E$_{g4}$ on the side of the semiconductor region i-NSC$_4$ to the energy gap E$_{g1}$ on the side of the semiconductor region n-NSC$_1$. The semiconductor region J-NSC$_6$ has an energy gap E$_{g6}$ which continuously changes from the energy gap E$_{g2}$ on the side of the semiconductor region p-NSC$_2$ to the energy gap E$_{g4}$ on the side of the semiconductor region i-NSC$_4$.

Figure 6:
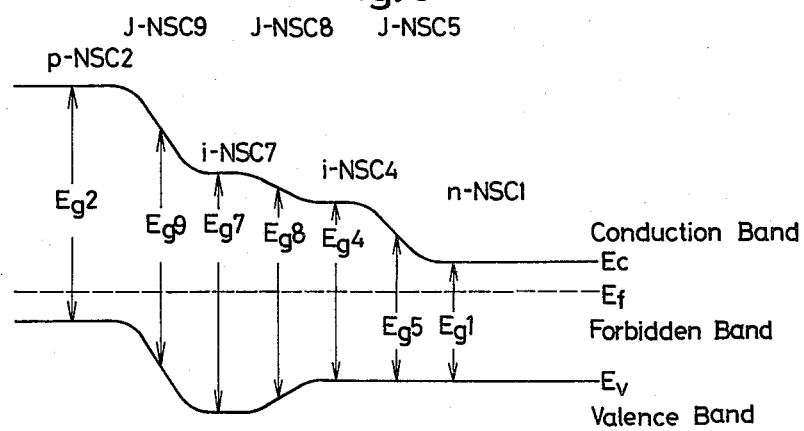

FIG. 6 illustrates, in terms of energy band structure, an example of the semiconductor layer 4 in the case of the present invention being applied to a semiconductor photoelectric conversion device which appears to be similar in construction to that described previously in connection with FIGS. 1 or 4 but in which the semiconductor layer 4 has a p-i-i-n type photocell structure. The semiconductor layer 4 is comprised of an n-type non-single-crystal semiconductor region n-NSC$_1$ which lies on the side of the electrode 2 and has an energy gap E$_{g1}$, a p-type non-single-crystal semiconductor region p-NSC$_2$ which lies on the side of the electrode 5 or 7 and has an energy gap E$_{g2}$ larger than that E$_{g1}$, an i-type non-single-crystal semiconductor region i-NSC$_4$ which lies in the central portion of the semiconductor layer 4 on the side of the semiconductor region n-NSC$_1$ and has an energy gap E$_{g4}$ larger than that E$_{g1}$ but smaller than that E$_{g2}$, an i-type non-single-crystal semiconductor region i-NSC$_7$ which lies in the central portion of the semiconductor layer 4 on the side of the semiconductor region p-NSC$_2$ and has an energy gap E$_{g7}$ larger than that E$_{g4}$ but smaller than that E$_{g2}$, a non-single-crystal semiconductor region J-NSC$_5$ which is defined between the semiconductor regions n-NSC$_1$ and i-NSC$_4$ and serves as an n-i heterojunction, a non-single-crystal semiconductor region J-NSC$_8$ which is defined between the semiconductor regions i-NSC$_4$ and i-NSC$_7$ and acts as i-i heterojunction, and a non-single-crystal semiconductor region J-NSC$_9$ which is defined between the semiconductor regions i-NSC$_7$ and p-NSC$_2$ and acts as a p-i heterojunction. In this instance, the semiconductor region J-NSC$_5$ has an energy gap E$_{g5}$ which successively changes from the energy gap E$_{g4}$ on the side of the semiconductor region i-NSC$_4$ to the energy gap E$_{g1}$ on the side of the semiconductor region n-NSC$_1$; the semiconductor region J-NSC$_8$ has an energy gap E$_{g8}$ which successively changes from the energy gap E$_{g7}$ on the side of the semiconductor region i-NSC$_7$ to the energy gap E$_{g4}$ on the side of the semiconductor region i-NSC$_4$; and the semiconductor region J-NSC$_9$ has an energy gap E$_{g9}$ which successively changes from the energy gap E$_{g2}$ on the side of the semiconductor region p-NSC$_2$ to the energy gap E$_{g7}$ on the side of the semiconductor region i-NSC$_1$.

Figure 7:
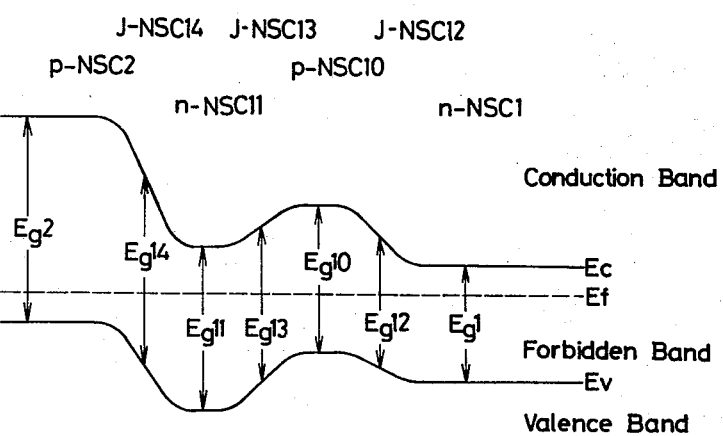

FIG. 7 shows, in terms of energy band structure, an example of the semiconductor layer 4 in the case of the present invention being applied to a semiconductor photoelectric conversion device which appears to be similar to that described previously in respect of FIG. 1 or 4 but in which the semiconductor layer 4 has a p-n-p-n type photocell structure. The semiconductor layer 4 includes an n-type non-single-crystal semiconductor region n-NSC$_1$ which lies on the side of the electrode 2 and has an energy gap E$_{g1}$, a p-type non-single-crystal semiconductor region p-NSC$_2$ which lies on the side of the electrode 5 or 7 and has an energy gap E$_{g2}$ larger than the energy gap E$_{g1}$, a p-type non-single-crystal semiconductor region p-NSC$_{10}$ which lies in the central portion of the semiconductor layer 4 on the side of the semiconductor region n-NSC$_1$ and has an energy gap E$_{g10}$ larger than that E$_{g1}$ but smaller than that E$_{g2}$, an n-type non-single-crystal semiconductor region n-NSC$_{11}$ which lies in the central portion of the semiconductor layer 4 on the side of the semiconductor region p-NSC$_2$ and has an energy gap E$_{g11}$ larger than that E$_{g10}$ but smaller than that E$_{g2}$, and non-single-crystal semiconductor regions J-NSC$_{12}$, J-NSC$_{13}$ and J-NSC$_{14}$ which are respectively defined between the semiconductor regions n-NSC$_1$ and p-NSC$_{10}$, between p-NSC$_{10}$ and n-NSC$_{11}$ and between n-NSC$_{11}$ and p-NSC$_2$ and serve as p-n heterojunctions. The semiconductor region J-NSC$_{12}$ has an energy gap E$_{g12}$ which successively changes from the energy gap E$_{g10}$ on the side of the semiconductor region p-NSC$_{10}$ to the energy gap E$_{g1}$ on the side of the semiconductor region n-NSC$_1$. The semiconductor region J-NSC$_{13}$ has an energy gap E$_{g13}$ which successibely changes from the energy gap E$_{g11}$ on the side of the semiconductor region n-NSC$_{11}$ to the energy gap E$_{g10}$ on the side of the semiconductor region p-NSC$_{10}$. The semiconductor region J-NSC$_{14}$ has an energy gap E$_{g14}$ which successively changes from the energy gap E$_{g2}$ on the side of the semiconductor region p-NSC$_2$ to the energy gap E$_{g11}$ on the side of the semiconductor region n-NSC$_{11}$.

Figure 8:
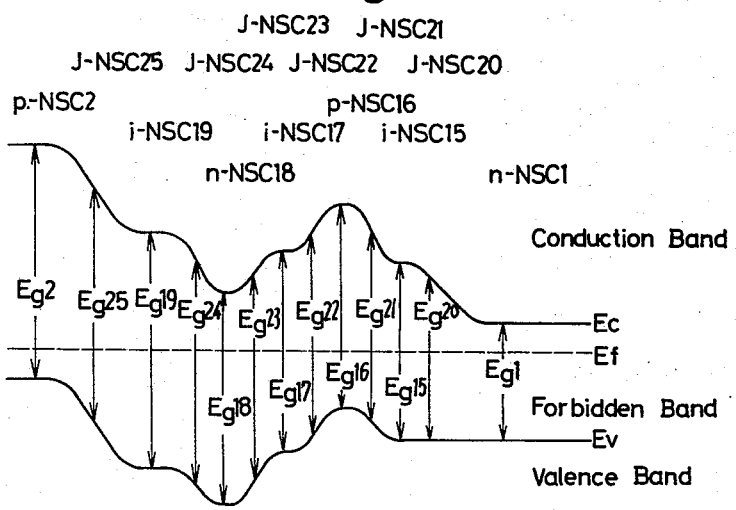

FIG. 8 shows, in terms of energy band structure, an example of the semiconductor layer 4 in the case of the present invention being applied to a semiconductor photoelectric conversion device which appears to be similar in construction to that described previously in respect of FIG. 1 or 4 but in which the semiconductor layer 4 has a p-i-n-i-p-i-n type photo cell structure.

The semiconductor layer 4, though not described in detail, includes n-type non-single-crystal semiconductor regions n-NSC$_1$ and n-NSC$_{18}$, p-type non-single-crystal semiconductor regions p-NSC$_2$ and p-NSC$_{16}$, i-type non-single-crystal semiconductor regions i-NSC$_{15}$, i-NSC$_{17}$ and i-NSC$_{19}$, and non-single-crystal semiconductor regions J-NSC$_{20}$ to J-NSC$_{25}$. The semiconductor region lies on the side of the electrode 2, the semiconductor region p-NSC$_2$ lies on the side of the electrode 5 or 7, and the semiconductor regions J-NSC$_{20}$, i-NSC$_{15}$, J-NSC$_{21}$, p-NSC$_{16}$, J-NSC$_{22}$, i-NSC$_{17}$, J-NSC$_{23}$, n-NSC$_{18}$, J-NSC$_{24}$, i-NSC$_{19}$ and J-NSC$_{25}$ are arranged in this order from the side of the semiconductor region n-NSC$_1$ towards the semiconductor region p-NSC$_2$. Letting the energy gaps of the semiconductor regions n-NSC$_1$, J-NSC$_{20}$, i-NSC$_{15}$, J-NSC$_{21}$, p-NSC$_{16}$, J-NSC$_{22}$, i-NSC$_{17}$, J-NSC$_{23}$, n-NSC$_{18}$, J-NSC$_{24}$, i-NSC$_{19}$, J-NSC$_{25}$ and p-NSC$_2$ be represented by E$_{g1}$, E$_{g20}$, E$_{g15}$, E$_{g21}$, E$_{g16}$, E$_{g22}$, E$_{g17}$, E$_{g23}$, E$_{g18}$, E$_{g24}$, E$_{g19}$, E$_{g25}$ and E$_{g2}$ respectively, they bear the following relation: $E_{g1} > E_{g20} > E_{g15} > E_{g21} > E_{g16} > E_{g22} > E_{g17} > E_{g23} > E_{g18} > E_{g24} > E_{g19} > E_{g25} > E_{g2}$.

In the semiconductor photoelectric conversion device of this invention, the semiconductor layer 4 may be constructed in such forms as: p-i-n type photodiode, p-i-i-n type photocell, p-n-p-n type photocell and p-i-n-i-p-i-n type photo cell, as described previously with respect to FIGS. 5, 6, 7 and 8 respectively. With any of such forms of the semiconductor layer 4 as mentioned above, it is possible to obtain the same feature as is obtainable with the semiconductor photoelectric conversion device of this invention in which the semiconductor layer 4 is constructed in the form of p-n type photodiode. In the cases of the semiconductor layer 4 being constructed in the forms of p-i-n type and p-i-i-n type photo diodes described in FIGS. 5 and 6 respectively, the resulting photoelectric conversion efficiency is higher than that obtainable in the case of the semiconductor layer 4 having the aforementioned p-n type photo diode structure. Moreover, the p-n-p-n type and p-i-n-i-p-i-n photocell structures of the semiconductor layer 4 both provide higher photoelectric conversion efficiency than those in the cases of the semiconductor layer 4 being constructed in the forms of p-i-n type and p-i-i-n type photodiodes.

The foregoing is merely illustrative of some examples of this invention, and in the foregoing the "p-type" can also be read "n-type" and vice versa.

In the present invention, the region forming each heterojunction and the regions on the both sides thereof in the semiconductor layer may also be formed of a material selected from a group consisting of silicon, germanium, silicon carbides, germanium carbides, silicon nitrides, germanium nitrides, silicon oxides and germanium oxides, other than the materials referred to in the foregoing examples.

It will be apparent that many modifications and variations may be effected without departing from the scope of the novel concepts of this invention.

What is claimed is:

1. A semiconductor photoelectric conversion device employing a semiconductor layer having at least one inter-semiconductor heterojunction, which comprises at least a first non-single-crystal semiconductor region having a first energy gap, a second non-single-crystal semiconductor region having a second energy gap different from the first energy gap, and a third non-single-crystal semiconductor region defined between the first and second semiconductor regions to serve as a heterojunction, and wherein the third semiconductor region has an energy gap which successively changes from the first energy gap on the side of the first semiconductor region to the second energy gap on the side of the second semiconductor region, and wherein the semiconductor layer has doped therein a recombination center neutralizer and a conductive material.

2. A semiconductor photoelectric conversion device according to claim 1, wherein the recombination center neutralizer is hydrogen or halogen or a combination of them.

3. A semiconductor photoelectric conversion device according to claim 1, wherein the conductive material is one or more of antimony, tellurium, tin, lead, indium, aluminum and gallium.

4. A semiconductor photoelectric conversion device according to claim 1, wherein each of the first, second and third semiconductor regions is formed of a material selected from a group consisting of silicon, germanium, silicon carbides, germanium carbides, silicon nitrides, germanium nitrides, silicon oxides and germanium oxides.

5. A semiconductor photoelectric conversion device according to claim 1, wherein the first semiconductor region is formed of $Si_xC_{1-x}$ where $0.5 < x < 1$, wherein the second semiconductor region is formed of Si, and wherein the third semiconductor region is formed of $Si_yC_{1-y}$ where the value of y is larger than the value of x and changes from the value of x on the side of the first semiconductor region to 1 on the side of the second semiconductor region.

6. A semiconductor photoelectric conversion device according to claim 1, wherein the first semiconductor region is formed of $Si_3N_{4-x}$ where $0 < x < 4$, wherein the second semiconductor region is formed of Si, and wherein the third semiconductor region is formed of $Si_3N_{4-y}$ where the value of y is larger than the value of x and changes from the value of x on the side of the first semiconductor region to 1 on the side of the second semiconductor region.

7. A semiconductor photoelectric conversion device according to claim 1, wherein the first semiconductor region is formed of $SiO_{2-x}$ where $0 < x < 2$, wherein the second semiconductor region is formed of Si, and wherein the third semiconductor region is formed of $SiO_{2-y}$ where the value of y is larger than the value of x and changes from the value of x on the side of the first semiconductor region to 1 on the side of the second semiconductor region.

* * * * *